United States Patent [19]
Ogura

[11] Patent Number: 6,144,600
[45] Date of Patent: Nov. 7, 2000

[54] SEMICONDUCTOR MEMORY DEVICE HAVING FIRST AND SECOND PRE-CHARGING CIRCUITS

[75] Inventor: Takeshi Ogura, Tokyo, Japan

[73] Assignee: NEC Corporation, Tokyo, Japan

[21] Appl. No.: 09/267,197

[22] Filed: Mar. 12, 1999

[30] Foreign Application Priority Data

Mar. 16, 1998 [JP] Japan .................................. 10-065175

[51] Int. Cl.[7] .................................................. G11C 7/00
[52] U.S. Cl. ...................... 365/203; 365/185.25; 365/210
[58] Field of Search .................................. 365/203, 210, 365/185.7, 185.2, 185.25, 189.07

[56] References Cited

U.S. PATENT DOCUMENTS

| | | | |
|---|---|---|---|
| 5,007,024 | 4/1991 | Tanaka et al. | 365/207 |
| 5,029,135 | 7/1991 | Okuba | 365/203 |
| 5,262,995 | 11/1993 | Yu | 365/203 |
| 5,537,349 | 7/1996 | Devin | 365/185.33 |
| 5,659,512 | 8/1997 | Koyanagi et al. | 365/203 |
| 5,671,186 | 9/1997 | Igura | 365/203 |
| 5,771,197 | 6/1998 | Kim | 365/210 |
| 5,963,484 | 10/1999 | Jung | 365/189.09 |
| 5,982,688 | 11/1999 | Han | 365/203 |

FOREIGN PATENT DOCUMENTS

7-130189  5/1995  Japan .

*Primary Examiner*—David Nelms
*Assistant Examiner*—Gene N. Auduong
*Attorney, Agent, or Firm*—Foley & Lardner

[57] ABSTRACT

A semiconductor memory device operable at a power source voltage in a wide range and capable of stably detecting data includes a potential detector for detecting a potential of a dummy bit line having a parasitic capacitance corresponding to a parasitic capacitance of bit lines and a plurality of second precharge circuits provided correspondingly to the respective bit lines, for precharging the respective bit lines in response to a precharge signal and terminating the precharge operation in response to an output of the potential detector.

18 Claims, 10 Drawing Sheets

POWER SOURCE VOLTAGE NORMAL :

Fig.10(a)
PRIOR ART

POWER SOURCE VOLTAGE DROPPED :

Fig.10(b)
PRIOR ART

POWER SOURCE VOLTAGE RISED :

Fig.10(c)
PRIOR ART

SEMICONDUCTOR MEMORY DEVICE HAVING FIRST AND SECOND PRE-CHARGING CIRCUITS

BACKGROUND OF THE INVENTION

1. Field of the Invention

The present invention relates to a semiconductor memory device and, particularly, a semiconductor memory device having a precharge circuit for precharging bit lines to a predetermined voltage.

2. Description of the Related Art

The field of use of the semiconductor memory device has been widened recently and semiconductor memory devices have been used in various electronic devices such as personal computers, television receivers and portable telephone sets. Although power source voltages of these electronic devices had been mainly 5 V, power source voltage is becoming as low as 2 to 3 V with the recent popularization of portable telephone set. Therefore, the recent semiconductor memory device is requested to operate within a power source voltage range as wide as 1.8 V to 5 V. The semiconductor memory device may include various memories such as read-only memory (ROM), write/read memory such as dynamic random access memory (DRAM) and static random access memory (SRAM) and memories such as erasable programmable ROM (EPROM) and electrically erasable PROM (EEPROM) which can hold stored information even when a power source is disconnected. Particularly, since an information stored in the SRAM among them is read out by using two complementary signal lines (bit lines), it is possible to read out the information relatively stably even if a power source voltage is varied.

In the ROM or the EPROM, however, it is usual that only one bit line is provided for every memory cell row. A sense amplifier is connected to the bit line and the sense amplifier amplifies a small signal read out from a memory cell and recovers an originally stored information "0" or "1". In such sense amplifier, in order to determine whether the stored information is "0" or "1", the stored information read out from a memory cell is compared with a certain reference. Therefore, although there is no problem when both the memory cell side and the reference side vary similarly with respect to a voltage variation, it becomes impossible to restore the originally stored information if the degree of variation of the characteristics of one side is different from that of the other side.

Japanese Patent Application Laid-open No. Hei 7-130189 discloses a semiconductor memory device capable of solving the above problem. The disclosed semiconductor memory device will be referred to as "prior art 1", hereinafter. According to the prior art 1, the voltage operation range of a sense amplifier circuit is expanded so that a normal read operation is possible even at low voltage. That is, in the prior art 1, a bias circuit composed of a precharge circuit for precharging a common data line connected to a plurality of data lines through respective selector switches and switch means for controlling precharge current is provided and, when a power source voltage is lowered, the precharge current is restricted.

The ROM is used mainly to read out a specific data stored therein and a data write can be done only once usually. Even when it is possible to write data therein a plurality times, it takes a relatively long time. For example, in an ROM, a program is performed by writing a specific data requested by a user in a mask used during a fabrication of a wafer thereof. An nMOS transistor is usually used as a memory cell constituting a mask ROM and a voltage sense type read circuit or a current sense type read circuit is used to read a data of the memory cell.

In the prior art 1, the sense amplifier is of the current sense type. Since the current sense type sense amplifier the originally stored information is determined by detecting a current variation of the bit line, sense time required for the determination does not depend on a discharge rate and so the data can be read out at high rate. However, in order to obtain a high rate read out, a large current is necessary, resulting in increased power consumption. Therefore, in an electronic device such as a portable telephone set which is driven by a battery, the lifetime of the battery is shortened. The voltage sense type sense amplifier is preferable in reducing the power consumption of the sense amplifier.

Figure 7:
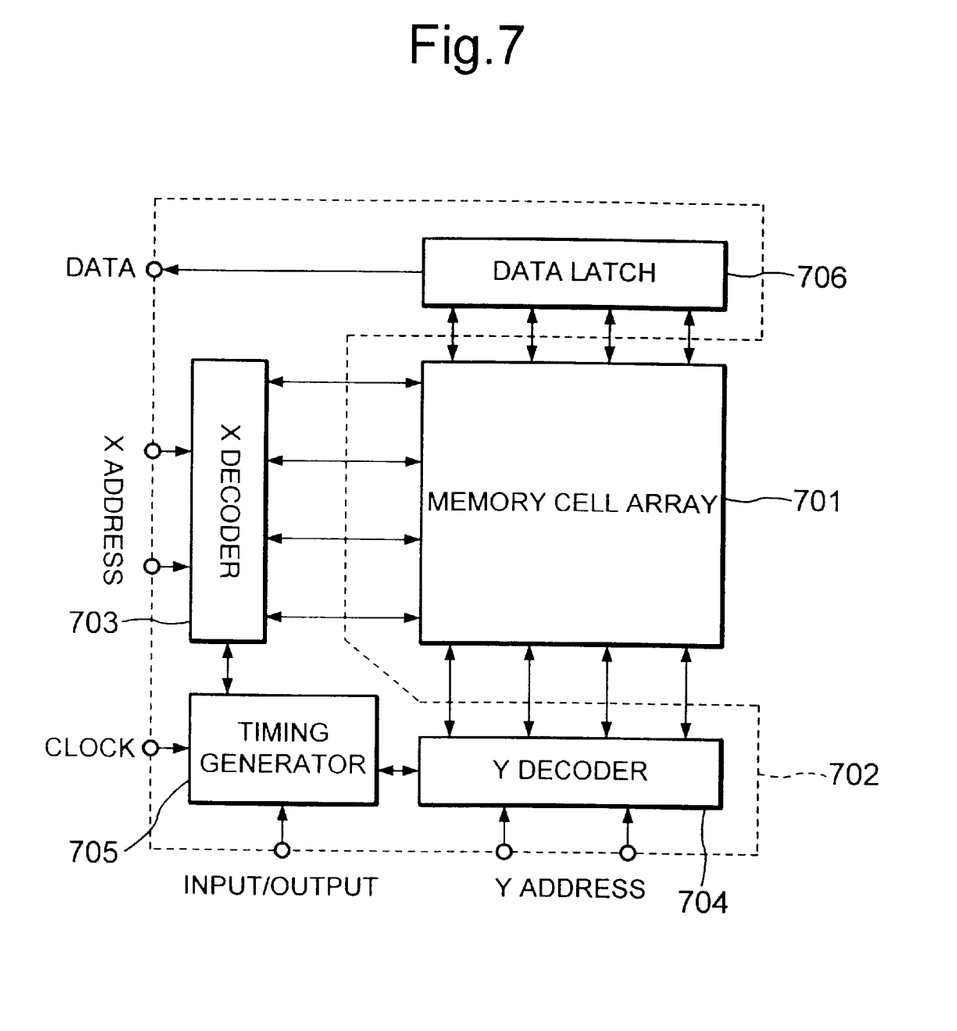
FIG. 7 is a block diagram showing a basic construction of a usual semiconductor memory device.

FIG. 7 is a block diagram showing a general construction of the voltage sense type semiconductor memory device. The semiconductor memory device shown in FIG. 7 comprises a memory cell array 701 and a peripheral circuit portion 702.

The peripheral circuit portion 702 includes an X decoder 703 inputted with an X address, a Y decoder 704 inputted with a Y address, a data latch circuit portion 706 for reading out data from a specific memory cell specified by the X address and the Y address and a timing generator circuit 705 responsive to an external clock signal and a control signal, for generating an internal clock signal including a precharge signal and a sampling clock signal.

Figure 8:
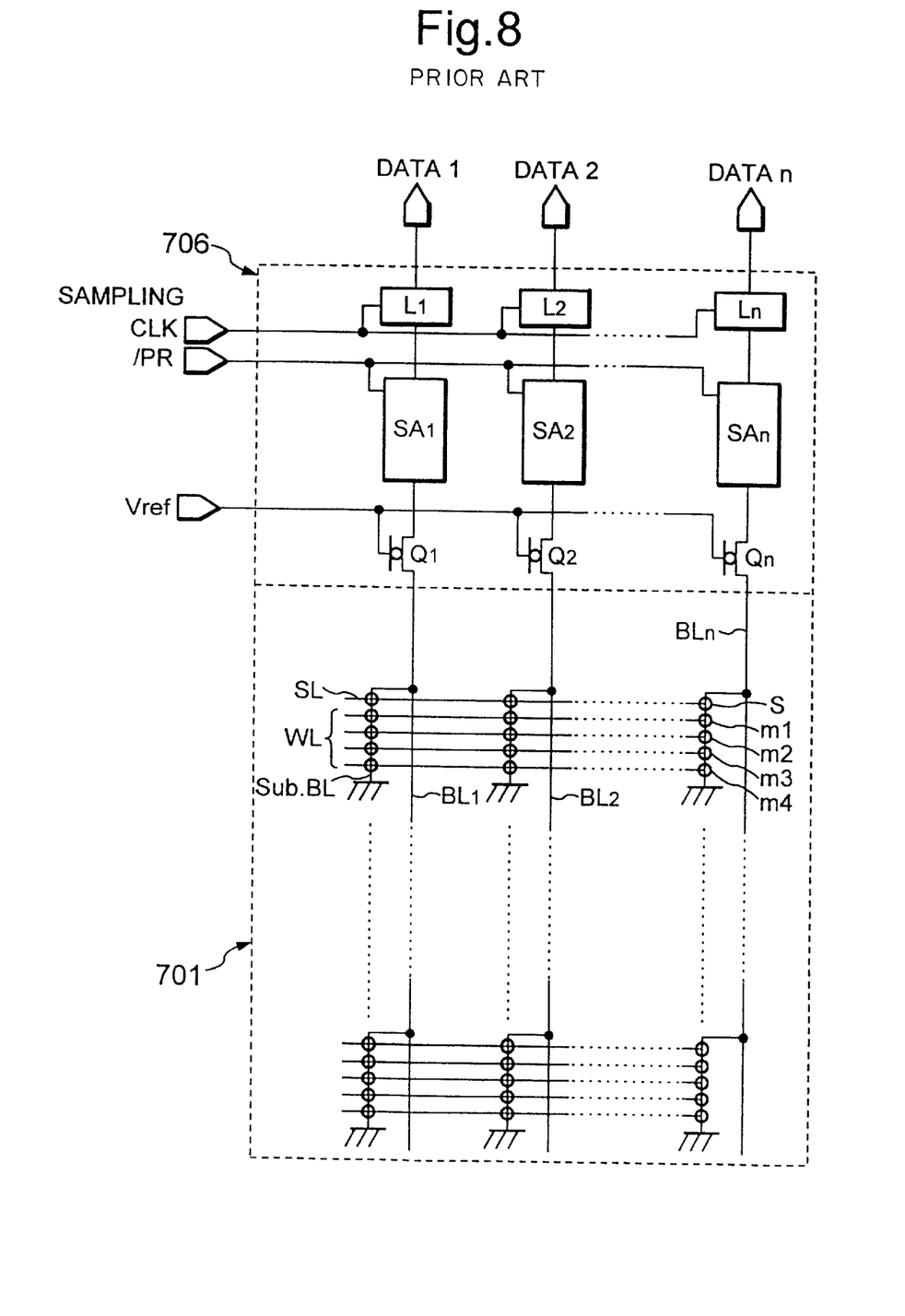
FIG. 8 is a circuit diagram of a first prior art semiconductor memory device.

FIG. 8 is a block diagram showing a construction of the data latch circuit portion 706 and the memory cell array 701 of the prior art 2. The memory array 701 is constructed with a plurality of memory blocks arranged in a matrix and each memory block is constructed with memory cells m1 to m4 and a selector transistor S. The selector transistor s and the memory cells m1 to m4 are connected in series on sub bit line SubBL and a source of the memory cell m4 is grounded. The memory block is selected by a bit line BL in column direction and by a word line WL and a selection line SL in row direction. The data latch circuit portion 706 is constructed with precharge transistors Q1 to Qn, sense amplifiers SA1 to SAn and latch circuits L1 to Ln, which are arranged correspondingly to bit lines BL1 to BLn arranged for respective rows of the memory array 701.

In reading out data from the memory cell, the precharge transistors Q1 to Qn are initially turned on simultaneously in response to a precharge signal /PR generated by the timing generator circuit 705 to precharge the respective bit lines BL1 to BLn to a predetermined potential Vref, where symbol "/" of /PR is a bar and /PR indicates an active low signal. In this example, threshold voltages of the transistors Q1 to Qn are commonly 0V and the gate voltages Vref are output at sources thereof as they are.

Then, in a data read period, one of the selection lines SL specified by the X address in the memory cell array becomes "1" and a corresponding memory block is selected. One of the word lines WL connected to the selected memory block, which is specified by the X address, becomes "0" and the remaining word lines become "1". The word lines WL are connected to gates of the memory cells and a memory cell and a selection transistor whose word line WL and selection line SL become "1" is turned on.

The memory cell whose word line WL becomes "0" determines whether or not a current flows therethrough depending upon a memory content thereof. When a current flows through the selected memory cell, precharged charge is discharged through the selection transistor S and the memory cells m1 to m4. Therefore, the potential of the bit line BL is changed to L. On the contrary, when there is no current flowing through the selected memory cell, the precharged charge is held as it is and, therefore, the potential of the bit line BL is kept at H. This potential is judged by the sense amplifier SA and signals which are "H" or "L" at an edge of the sampling clock CLK are latched by the respective latch circuits L1 to Ln and outputted externally through the data bus.

Figure 9A:
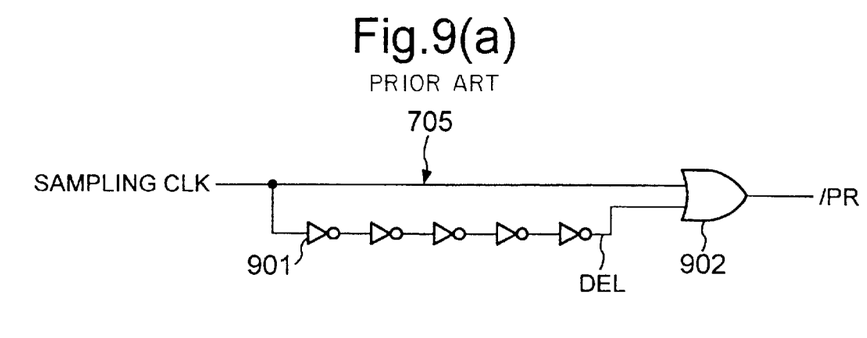

FIG. 9(a) shows a detailed precharge signal generator portion of the timing generator circuit 705 shown in FIG. 7. The precharge signal generator portion is constructed with an analog delay circuit composed of a plurality of series connected inverters 901 for obtaining a desired delay time and an OR gate 902.

Odd numbered inverters of the series connected inverters 901 have one threshold voltages and even numbered inverters have another threshold voltages, so that the delay time of each inverter stage becomes large. Outputs of the odd numbered inverters fall in response to a rising edge of the sampling clock CLK and outputs of the even numbered inverters rise, while the outputs of the odd numbered inverters rise in response to a falling edge of the sampling clock CLK and those of the even numbered inverters fall.

Figure 9B:
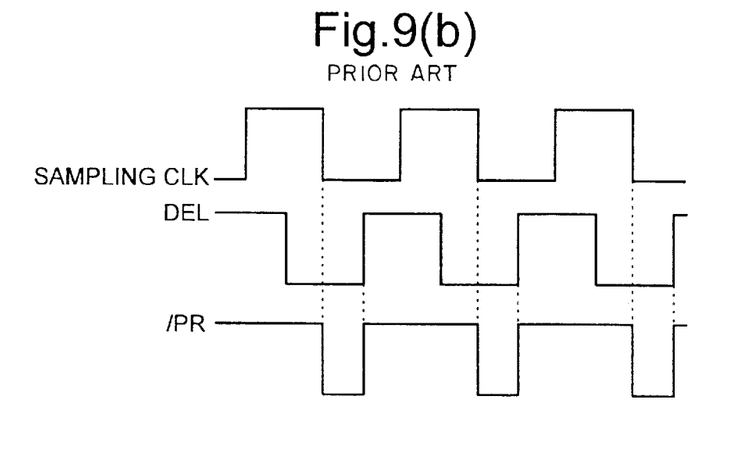
FIG. 9(b) is a timing chart of the precharge signal timing generator circuit shown in FIG. 9(a)

FIG. 9(b) shows a timing chart of the precharge signal /PR. The precharge signal /PR is generated by an OR operation of the input clock signal CLK and a delay signal DEL. In order to design the inverters 901 such that an optimal delay time is obtained at high power source voltage Vdd, for example, 5 V, the threshold value of each inverter stage may be set 4 V or 1 V. When the power source voltage is lowered to 2 V under this condition, an output of a preceding inverter does not exceed the threshold value of a succeeding inverter and, therefore, the series connected inverters 901 does not work. On the other hand, since the threshold value of the OR gate 902 is set to a half of the power source voltage, the precharge signal generator portion operates even when the power source voltage becomes 2 V. Therefore, a signal which is substantially the same as the sampling clock CLK is output as the precharge signal /PR.

On the contrary, if the series connected inverters 901 are designed such that the optimal delay time is obtained at low power source voltage vdd, for example, 2 V, threshold value of each inverter stage may be set to 1.5 V or 0.8 V. When the power source voltage is increased to 5 V under this condition, an output of a preceding inverter immediately exceeds the threshold value of a succeeding inverter and, therefore, it becomes impossible to obtain enough delay time. Even if an OR operation of such delay time and the sampling clock CLK is performed, a time period in which the precharge signal /PR is L becomes very short.

Figure 9C:
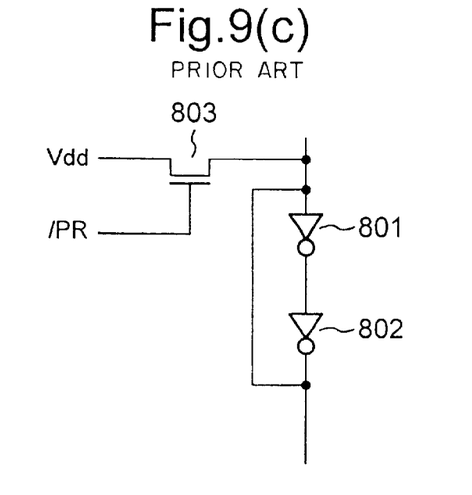
FIG. 9(c) shows a sense amplifier circuit of the first prior art semiconductor memory device shown in FIG. 8.

FIG. 9(c) shows a circuit construction of each of the identical sense amplifiers SA1 to SAn. Taking the sense amplifier SA1 as an example, it is constructed with series connected inverters 801 and 802 connected between the latch circuit L1 and the transistor Q1 and a PMOS transistor 803 having a source-drain circuit connected between an input of the inverter 801 and a power source line supplying the power source voltage and a gate supplied with the precharge signal /PR. The PMOS transistor 803 of the sense amplifier SA1 becomes conductive when the precharge signal /PR becomes active, that is, when it becomes low level, to precharge the bit line BL1 up to the reference voltage Vref through the PMOS transistor Q1. Thereafter, the sense amplifier SA1 operates such that an output thereof becomes high level or low level correspondingly to a variation of the potential of the bit line through a circuit composed of the inverters 801 and 802 when the precharge signal /PR becomes inactive, that is, high level. In this example, it is assumed that a current supply function is smaller than that of the PMOS transistor 801, the selection transistor SL and the transistors m1 to m4 constituting the memory cells.

Figure 10A:
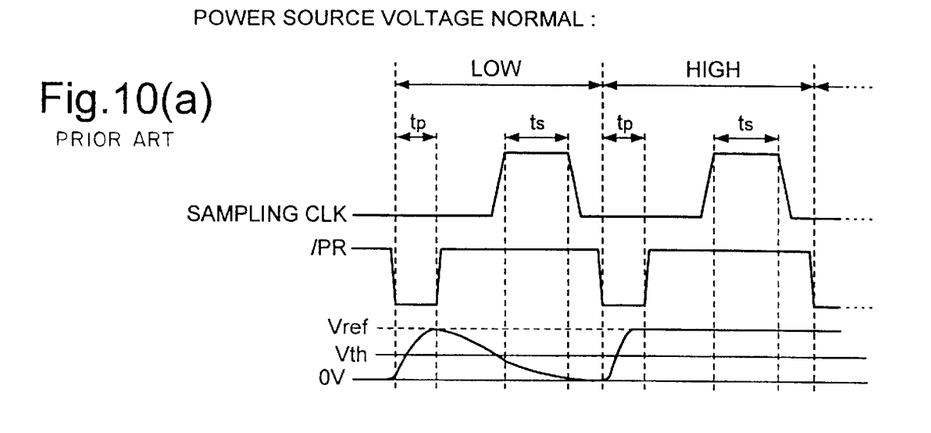
FIG. 10(a) is a precharge timing chart of a second prior art semiconductor memory device when a power source voltage is normal.
Figure 10B:
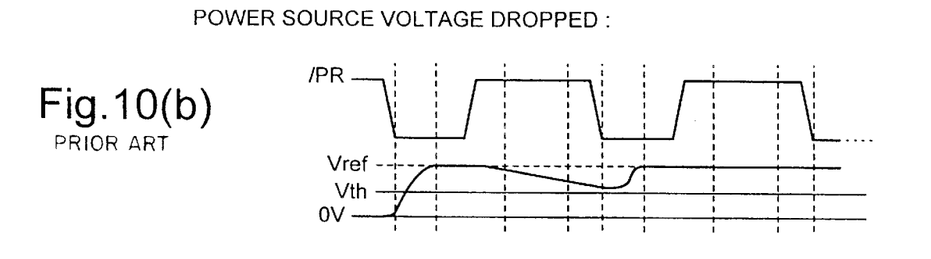
FIG. 10(b) is a precharge timing chart of the second prior art semiconductor memory device when the power source voltage is increased.
Figure 10C:
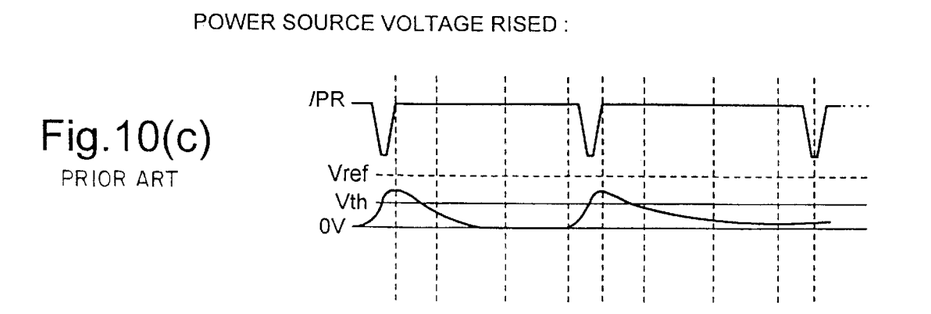
FIG. 10(c) is a precharge timing chart of a second prior art semiconductor memory device when a power source voltage reduced.

FIG. 10(a) shows a signal timing chart in precharging operation when the power source voltage is normal in the conventional semiconductor memory device, FIG. 10(b) shows a signal timing chart of a semiconductor memory device designed for high power source voltage when the power source voltage is lowered and FIG. 10(c) shows a signal timing chart of a semiconductor memory device designed for low power source voltage when the power source voltage is increased. In each of FIGS. 10(a), 10(b) and 10(c), it is assumed that a content of a memory cell in a first read cycle is "0" (ON) and that in a second read cycle is "1" (OFF).

In FIG. 10(a), a bit line BL is precharged up to a reference voltage Vref in a time period (tp) in which the precharge signal /PR is active and normally discharged in a sampling time period (ts), so that the sense amplifier correctly recognize "H" or "L" state of the bit line. It should be noted here that an address supply to the memory cell is performed in response to the rise of the precharge signal /PR.

In FIG. 10(b), when the power source voltage is reduced, a pulse width of the precharge signal /PR is broadened and the precharge time period (tp) becomes longer. Therefore, the charge on the bit line can not be discharged enough during the sampling time period (ts) of the first read cycle performed in response to the address supply in response to the rise of the precharge signal /PR, so that the voltage of the bit line can not be lowered down below the threshold voltage Vth of the precharge transistors (Q1 to Qn). Therefore, even if the information stored in the selected memory cell is "0" (ON), it is judged as "1" (OFF) erroneously.

In FIG. 10(c), the output of the OR gate 902 of the precharge signal generator portion becomes narrower than the desired output pulse width (tp) of the precharge signal /PR. Therefore, the bit line is not charged enough during the precharge time period (tp) and the potential of the bit line is lowered down below the threshold voltage Vth of the precharge transistor (Q1 to Qn), so that, even if the information stored in the selected memory cell is "1", it is judged as "0", erroneously.

As mentioned above, the power source voltage for the semiconductor memory device is becoming lowered and the semiconductor memory device is requested to operate with the power source voltage in the range as wide as from 1.8 V to 5 V. In order to obtain the semiconductor memory device operable in such wide power source voltage range, it is necessary to solve the problem of erroneous detection of signal on the bit line due to the width of the precharge signal generated by the timing generator circuit portion.

SUMMARY OF THE INVENTION

An object of the present invention is to provide a semiconductor memory device which operates with a wide range of power source voltage and is capable of stably detecting data.

In order to achieve the above object, a semiconductor memory device according to the present invention comprising a plurality of bit lines to which a plurality of memory cells are connected, respectively, and a plurality of first precharge means provided correspondingly to the respective bit lines for precharging the respective bit lines to a first potential in response to a precharge signal is featured by comprising a plurality of second precharge means provided correspondingly to the respective bit lines for precharging the respective bit lines to a second potential in response to the precharge signal.

The semiconductor memory device of the present invention further comprises a plurality of potential detection means each for detecting an increase of the potential of the bit line to a predetermined potential, wherein the second precharge means preferably terminate their precharging operations when the potential detection means detect the potential increase of the bit lines up to the predetermined potential.

The semiconductor memory device of the present invention further comprises a plurality of dummy bit lines having capacitances corresponding to parasitic capacitances of the respective bit lines including the memory cells, wherein the potential detection means preferably detect that potentials of the dummy bit lines rise up to a predetermined potential. In this case, the dummy bit lines are preferably connected to dummy memory cells corresponding to a portion of the memory cells connected to the respective bit lines.

In the semiconductor memory device of the present invention, which is provided with the second precharge means, a stable precharge can be achieved even when the power source voltage is lowered or risen and, so, it becomes possible to stably read out the memory contents in a wide range operating voltage.

BRIEF DESCRIPTION OF THE DRAWINGS

FIG. 9 (a) is a precharge signal timing generator circuit of the first prior art semiconductor memory device shown in FIG. 8;

DETAILED DESCRIPTION OF THE PREFERRED EMBODIMENTS

In the present invention, the problem described with reference to FIG. 10(b) is solved by optimizing the construction of the precharge signal generator portion shown in FIG. 9 such that a normal read of the memory cell content is possible even when the power source voltage is lowered. This optimization can be realized by making an absolute value of the threshold voltage of the transistor constituting the inverter of the prior art precharge signal generator portion small. However, with such circuit construction, the problem described with reference to FIG. 10(c) occurs. Therefore, according to the present invention, the problem shown in FIG. 10(b) is solved by optimizing the construction of the precharge signal generator as mentioned, while solving the problem related to FIG. 10(c) by providing a plurality of second precharge circuits in parallel to the precharge circuits of the prior art semiconductor memory device.

Now, the present invention will be described in detail with reference to the drawings. A basic construction of a semiconductor memory device according to the present invention is similar to that shown in FIG. 7. That is, the semiconductor memory device is constructed with a memory cell array portion 701 and a peripheral circuit portion 702. The peripheral circuit portion 702 includes an X decoder 703 inputted with an X address, a Y decoder 704 inputted with a Y address, a data latch circuit 706 for reading out a memory data from a memory cell specified by the X and Y addresses and a timing generator circuit 705 inputted with an external clock signal for generating an internal clock signal including a precharge signal and a sampling clock signal.

Figure 1:
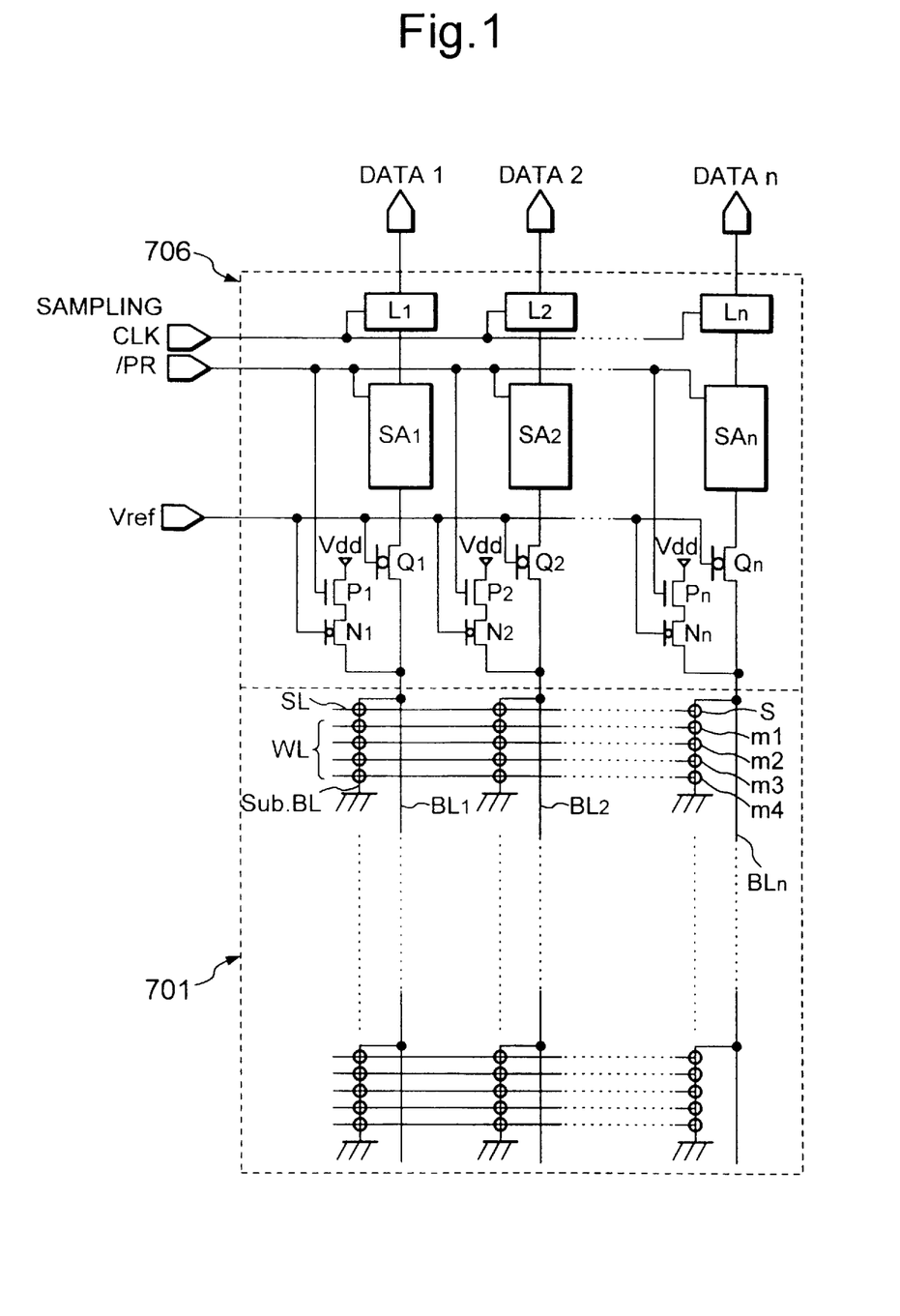
FIG. 1 is a circuit diagram of a semiconductor memory device according to a first embodiment of the present invention.

As shown in FIG. 1 which shows a first embodiment of the present invention, the memory cell array portion 701 includes a number of memory cells arranged in a column and row matrix and a number of bit lines (BL1 to BLn) are arranged in respective columns of the memory cells. A plurality of sub bit lines SubBL each including a plurality of cell transistor groups each including a selection transistor S and four cell transistors m1 to m4, all of which are connected in series, are NOR-connected to each bit line BL. In order to select one of the memory cells related to each bit line, a corresponding selection transistor S is turned ON, a corresponding word line WL is made active ("L") and other word lines WL are made inactive ("H"). When a content of the thus selected memory cell is "1" (OFF), the potential of the bit line becomes "H" at the sampling time point and, when it is "0" (ON), the bit line potential becomes "L" at the sampling time point.

The data latch circuit portion 706 is constructed with precharge transistors Q1 to Qn, sense amplifiers SA1 to San, latch circuits L1 to Ln and p type transistors P1 to Pn and n type transistors N1 to Nn, all of which are arranged for the respective bit lines BL1 to BLn. The p type transistors P1 to Pn and the n type transistors N1 to Nn constitute second precharge circuit portions, respectively.

In reading out the data from the selected memory cell, the data latch circuit portion 706 charges the bit lines through the precharge transistors (Q1 to Qn) when the precharge signal /PR is in an active state. Since the reference voltage Vref is applied to the gates of the precharge transistors (Q1 to Qn), each bit line is charged up to a voltage obtained by subtracting the threshold voltage of the precharge transistor from the reference voltage Vref. Since, in this embodiment, the threshold voltage Vth is 0 V, potentials of the bit lines becomes Vref. The sense amplifiers (SA1 to SAn) detect voltage change of the bit lines at the sampling time and output "H" or "L". That is, when the potential of the bit line is larger than the threshold voltage Vth which is a half of the reference voltage Vref, the sense amplifier outputs "H" data and, when it is smaller than the threshold voltage Vth, the sense amplifier outputs "L" data.

Figure 2:
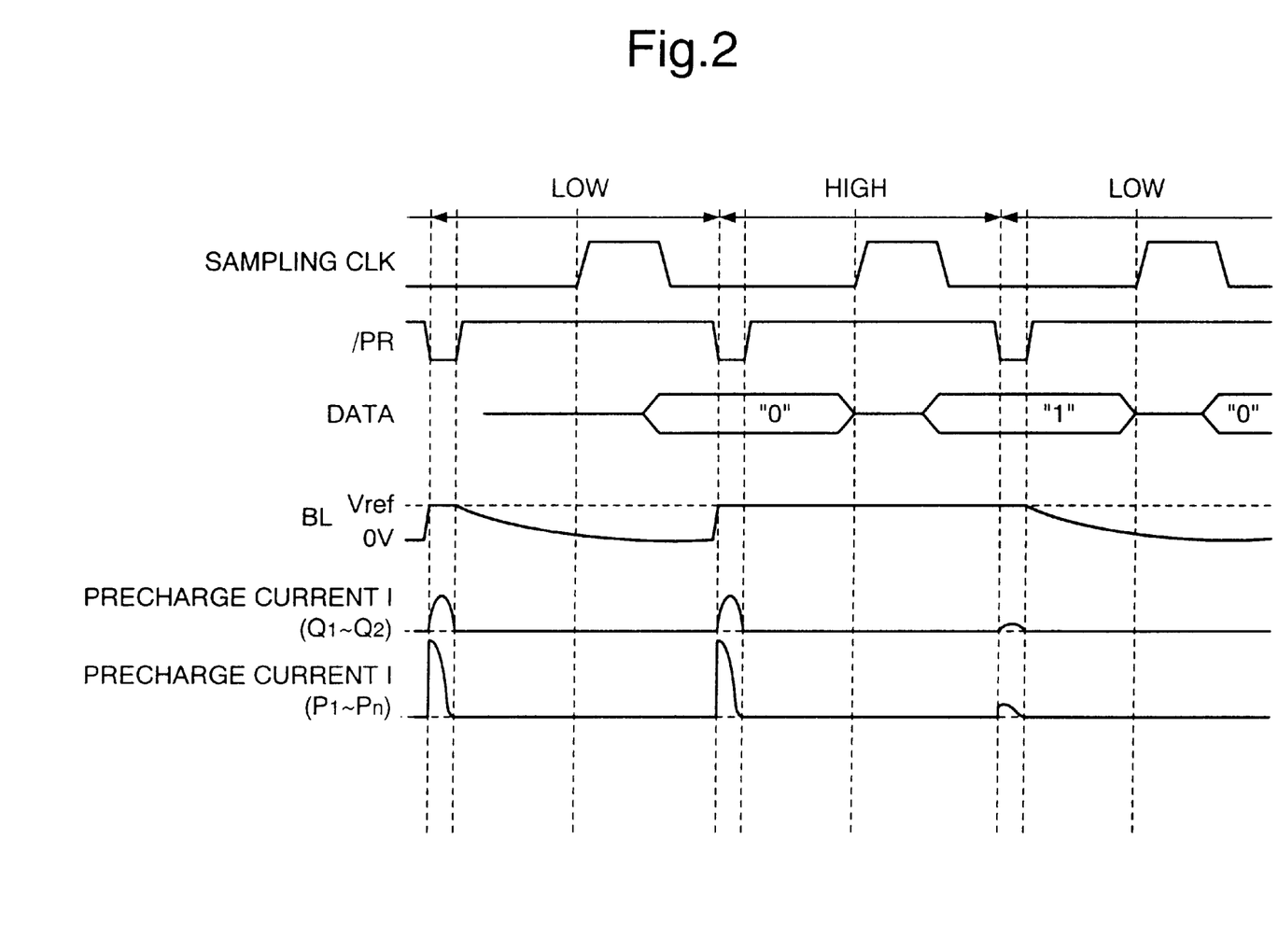
FIG. 2 is a timing chart showing an operation of the semiconductor memory device shown in FIG. 1.

An operation of the first embodiment will be described with reference to FIG. 1 and FIG. 2 which shows a signal timing chart. When the precharge signal /PR becomes "L", the p type transistors (P1 to Pn) are turned ON. The n type transistors (N1 to Nn) having the gates applied with the reference voltage Vref are also turned ON. Therefore, in addition to the charging by the sense amplifiers (SA1 to SAn) and the n type transistors (Q1 to Qn) which constitute the first precharge circuit, a charging by the second precharge circuit is started, so that the potential of the bit lines is increased up to a potential Vref–Vth, where Vth is the threshold voltage of the n type transistor. Since the threshold voltage Vth is 0 V in this case, the bit line potential is increased up to Vref.

In response to the rising edge of the precharge signal /PR, a word line corresponding to the address is selected and, when the information stored in the selected memory cell is "0", the charge of that bit line is discharged and, when the information is "1", the charge of the bit line is not discharged. In the example shown in FIG. 2, the information stored in the selected memory cell is "0" in the first and third read cycles and the bit line is charged up to the precharge voltage and then the potential is reduced. In the second read cycle, the information stored in the selected memory cell is "1". Therefore, the bit line is charged up to the precharge voltage and there is substantially no discharge thereafter, so that the bit line is kept at the high potential.

The potential of the bit line is detected by the sense amplifier (SA1, . . . , SAn) at a time when the sampling clock becomes "H". In this case, it is judged at the rising edge of the sampling clock CLK whether the information stored in the selected memory cell is "0" or "1". The judged data is held in the latch circuit (L1, . . . , Ln) and then outputted externally.

In the semiconductor memory device of this embodiment, the bit line is precharged by the first precharge circuit which is the conventional circuit and the second precharge circuit. Therefore, it is possible to obtain a sufficient precharge voltage within a short time even when the pulse width of the precharge signal is small at high power source voltage. Consequently, there is no detection error of the sense amplifier (SA1, . . . , SAn) occurs in the first to third read cycles. Charge precharged on the bit line is supplied from the power source Vdd through the transistors Pn and Nn. Since the drive performance of the transistors Pn and Nn is large, it is possible to precharge within a short time and, since the gate voltage of the transistor Nn is Vref, the source potential, that is, the bit line potential, does not become larger than Vref. Therefore, the precharge by the transistors Pn and Nn is automatically stopped, so that unnecessary current does not flow and the power consumption can be restricted minimum.

Figure 3:
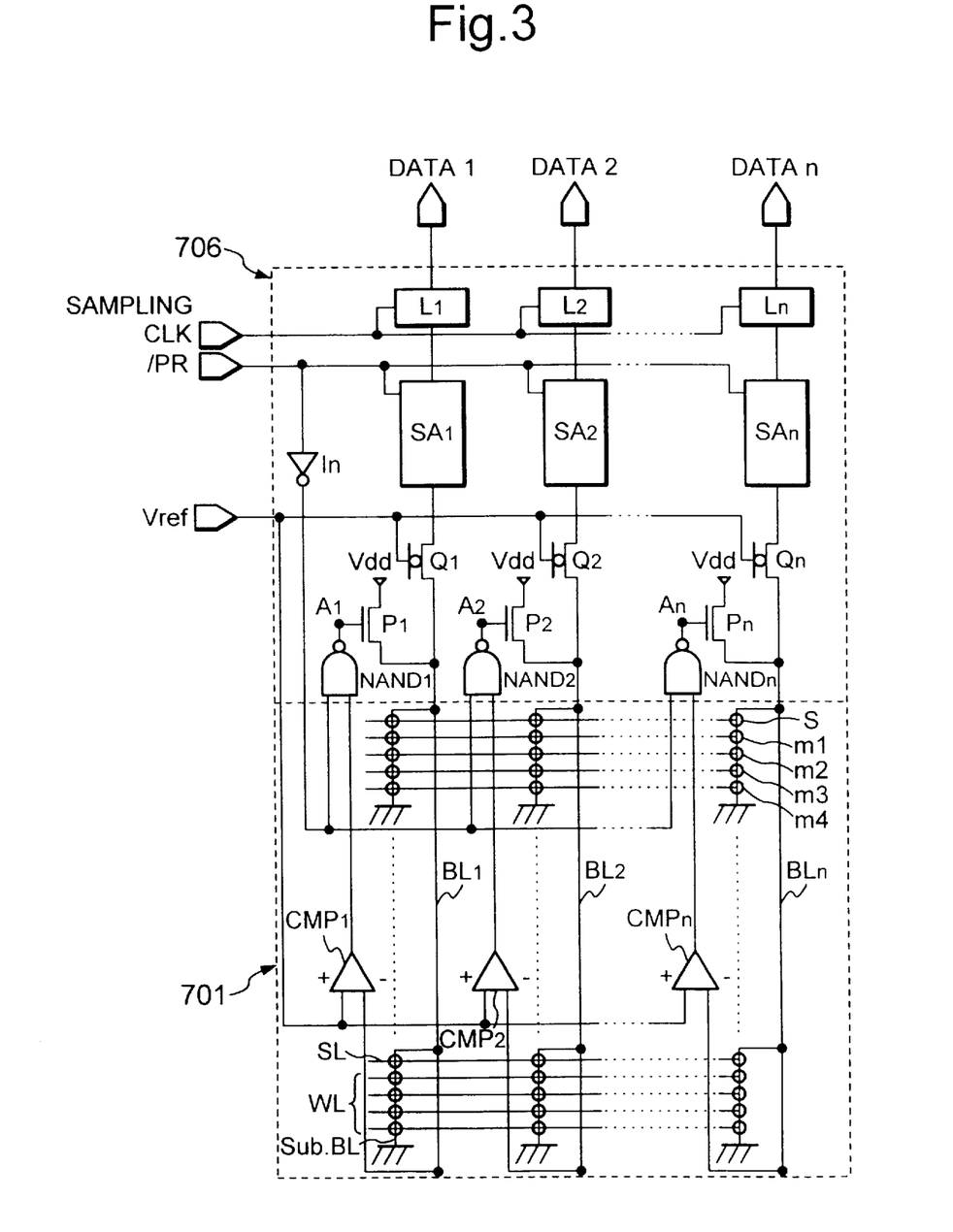
FIG. 3 is a circuit diagram of a semiconductor memory device according to a second embodiment of the present invention.

FIG. 3 shows a construction of a semiconductor memory device according to a second embodiment of the present invention. The semiconductor memory device shown in FIG. 3 differs from the semiconductor memory device shown in FIG. 1 in that the second precharge circuit is constructed with an inverter In, NAND gate circuits (NAND1 to NANDn), comparators (CMP1 to CMPn) and p type transistors (P1 to Pn). The remaining portion of the semiconductor memory device according to the second embodiment shown in FIG. 3 is similarly constructed to that of the first embodiment shown in FIG. 1.

The precharge signal /PR is supplied to an input of the inverter In whose output is connected to one input of the NAND gates (NAND1 to NANDn). Positive inputs of the comparators (CMP1 to CPMn) are connected to the reference voltage Vref and negative inputs thereof are connected to the respective bit lines (BL1 to BLn). Outputs of the comparators are connected to the other inputs of the respective NAND gates (NAND1 to NANDn).

The outputs of the NAND gages (NAND1 to NANDn) are connected to gates of the respective p type transistors (P1 to Pn) whose sources are connected to the power source Vdd and drains are connected to the respective bit lines (BL1 to BLn).

Figure 4:
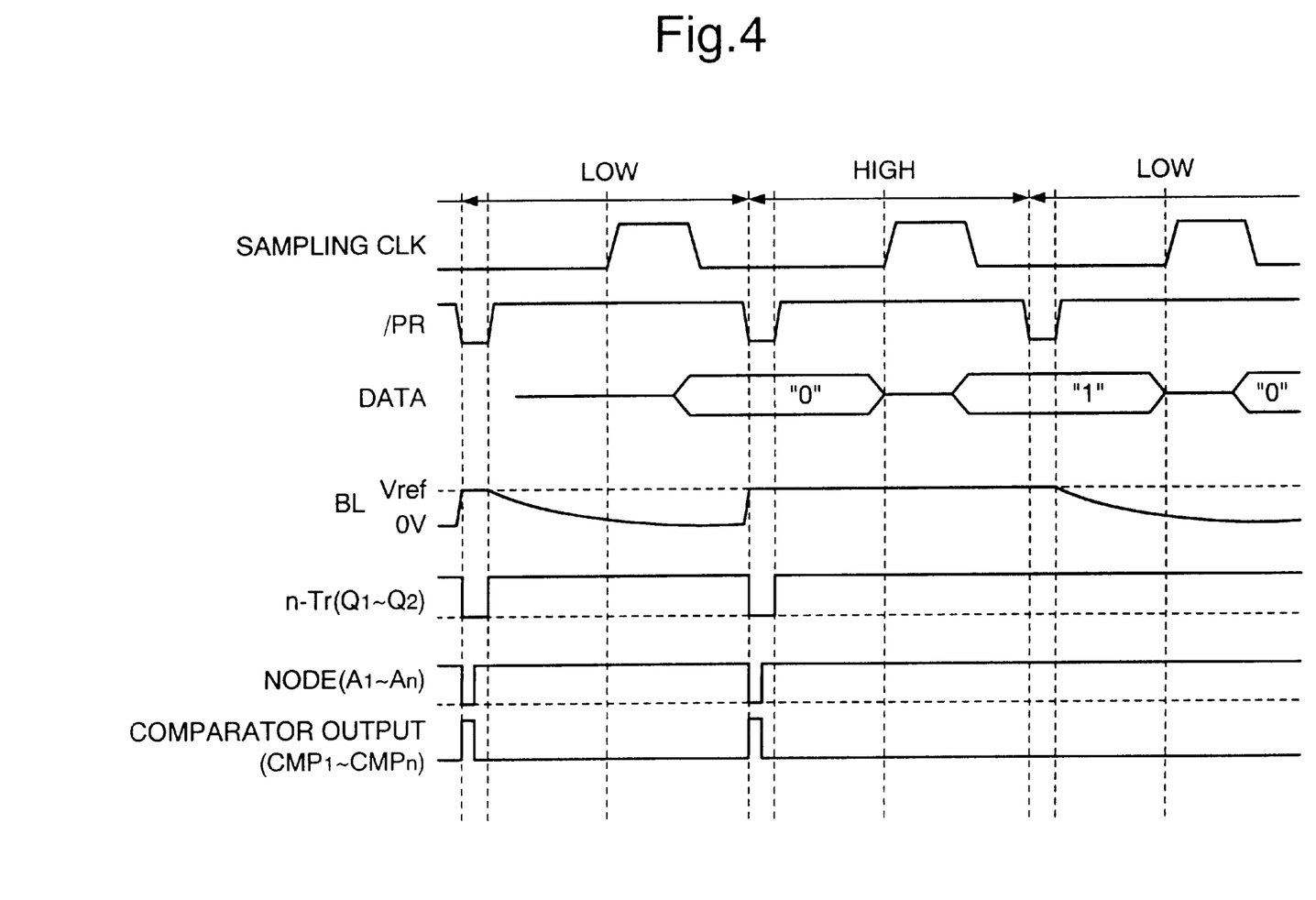
FIG. 4 is a timing chart showing an operation of the semiconductor memory device shown in FIG. 4.

An operation of the semiconductor memory device according to the second embodiment shown in FIG. 3 will be described with reference to FIG. 4 which shows a signal timing chart. When the precharge signal /PR is "H", the output of the inverter In becomes "L" and the outputs of the NAND gates (NAND1 to NANDn) become "H". Therefore, p type transistors (P1 to Pn) are in OFF state. When the precharge signal /PR becomes "L", the output of the inverter In becomes "H". The inverted inputs of the comparators (CMP1 to CMPn), that is, the potentials of the bit lines are compared with the reference voltage Vref, respectively. When the potential of the bit line is lower than the reference voltage Vref, the output (node A1, . . . , An in FIG. 4) of the comparator CMP becomes "H" and the output of the NAND gate becomes "L". Therefore, the p type transistor (P1, . . . , Pn) is turned ON to rapidly charge the bit line (BL1, . . . , BLn) from the power source Vdd.

When the potential of the bit line (BL1, . . . , BLn) becomes higher than the reference voltage Vref, the output of the comparator is inverted to "L" and the output (node A1, . . . , An) of the NAND gate (NAND1, . . . , NANDn) becomes "H", so that the p type transistor (P1, . . . , Pn) is turned OFF to stop the charging of the bit line. The precharging by the n type transistor (Q1, . . . , Qn) continues for a time period in which the precharge signal /PR is "L".

In this embodiment, the bit line is rapidly charged from the power source Vdd while sensing the potential of the bit line by the comparator CMP. Therefore, the sufficient precharge voltage can be obtained within a short time even if the power source voltage is increased and the width of the precharge signal /PR becomes small. As a result, there is no detection error of the sense amplifier (SA1 . . . , SAn) occurs.

Figure 5:
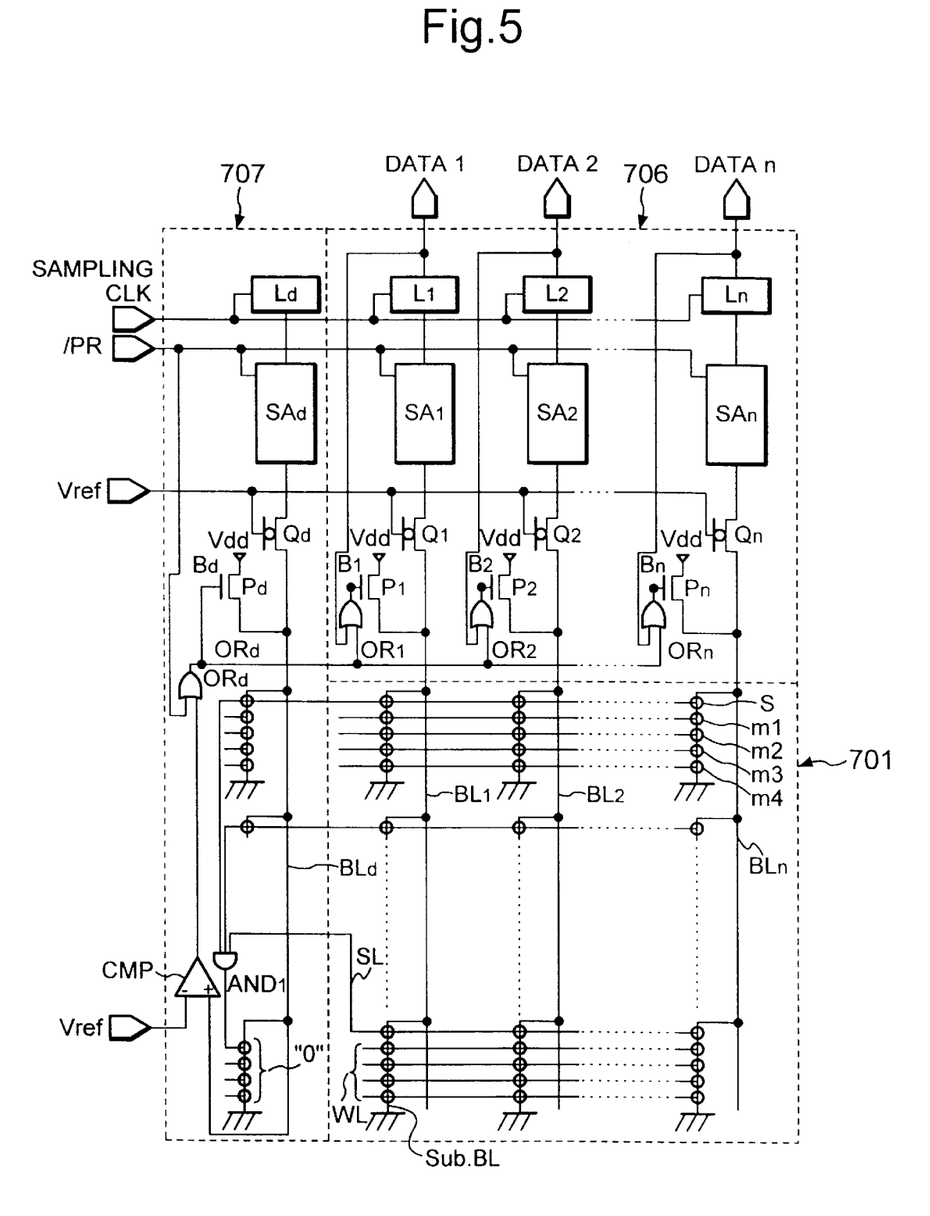
FIG. 5 is a circuit diagram of a semiconductor memory device according to a third embodiment of the present invention.

FIG. 5 shows a construction of a semiconductor memory device according to a third embodiment of the present invention. The semiconductor memory device of the third embodiment differs from the semiconductor memory device of the second embodiment of the present invention in that a dummy circuit portion 707 is provided to control the second precharge circuit. The dummy circuit portion 707 is composed of a p type transistor Pd, an OR gate (ORd), a comparator CMP and an AND gate (ANDL) The second precharge circuit is composed of p type transistors (P1 to Pn) and OR gates (OR1 to ORn). The remaining circuit portion of the semiconductor memory device shown in FIG. 5 is constructed similarly to that of the second embodiment shown in FIG. 3.

One input of the dummy OR gate (ORd) of the dummy circuit portion 707 is supplied with a precharge signal /PR and an output thereof is connected to a gate of the p type transistor Pd and one inputs of the OR gates (OR1 to ORn) of the respective bit lines. An inverted input of the comparator CMP is connected to the reference voltage Vref and a positive input thereof is connected to the dummy bit line BLd. An output of the comparator CMP is connected to the other input of the OR gate ORd. The other inputs of the OR gates (OR1 to ORn) are connected the respective latch circuits (L1 to Ln).

Figure 6:
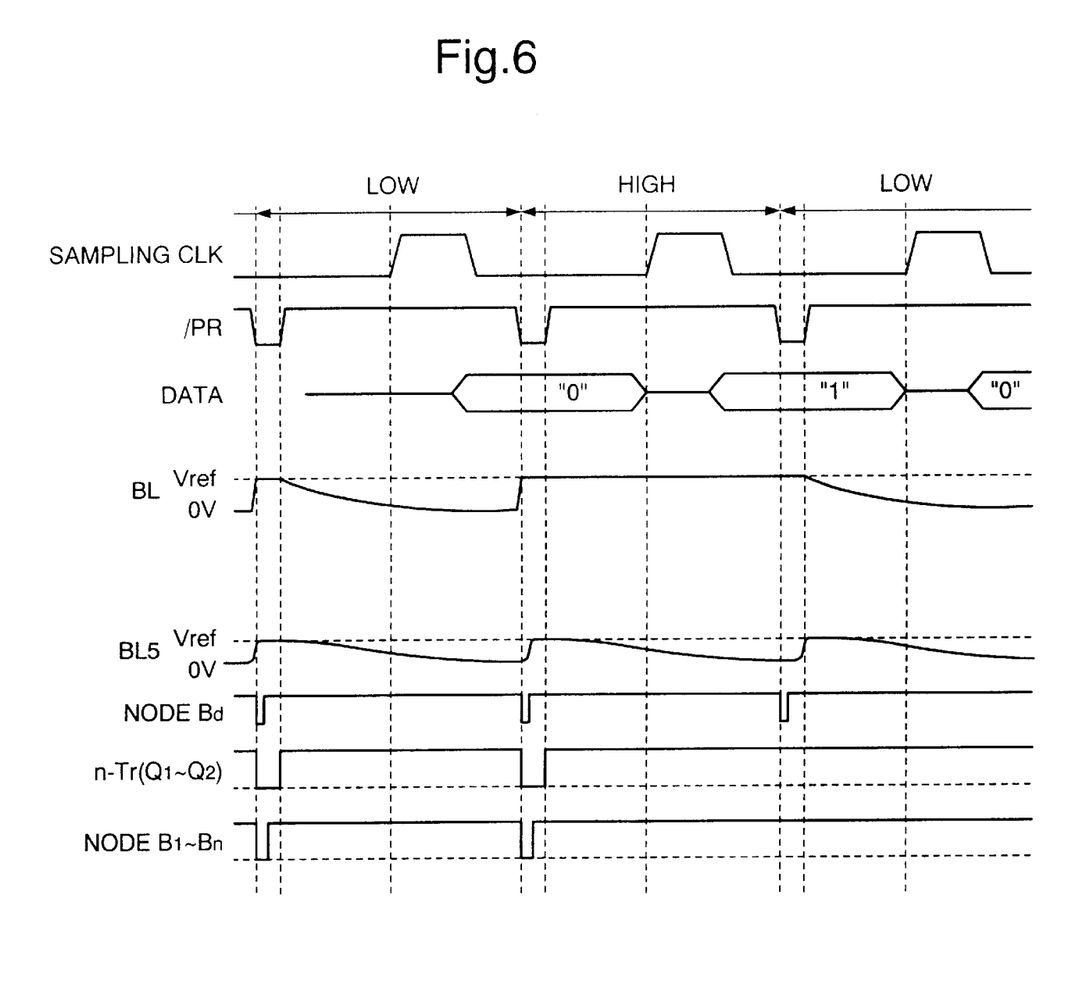
FIG. 6 is a timing chart showing an operation of the semiconductor memory device shown in FIG. 5.

An operation of the semiconductor memory device according to the third embodiment shown in FIG. 5 will be described with reference to FIG. 6 which shows a signal timing chart. When the precharge signal /PR is "H", the output of the OR gate ORd (node Bd in FIG. 6) is "H" and the p type transistor Pd is in OFF state.

When any one of the selection lines SL is selected, the output of the AND gate (ANDL) become "H" and the potential charged on the dummy bit line is discharged through a dummy sub bit line SubBL having an information corresponding to data of all of the memory cells (m1 to m4) which are "0".

When the precharge signal /PR becomes "L", one input of the dummy OR gate PRd becomes "L". The potential of the dummy bit line BLd is compared with the reference voltage Vref and, when it is lower than the reference voltage Vref, the output of the comparator CMP becomes "L" and the output of the OR gate ORd (node Bd in FIG. 6) also becomes "L". Thus, the p type transistor Pd is turned ON, so that the dummy bit line BLd is rapidly charged from the power source Vdd.

One inputs of the OR gates (OR1 to ORn) of the bit lines are supplied with the data read out in the preceding read cycle and the other inputs thereof are supplied with the output of the dummy OR gate ORd. When the data read out in the preceding read cycle is "0", the potential on the bit line (BL5 in FIG. 6) is discharged. In this case, the output (nodes BL1 to BLn in FIG. 6) of the OR gates (OR1 to ORn) become "L". Therefore, the p type transistors (P1 to Pn) are turned ON so that the bit lines (BL1 to BLn) are charged rapidly from the power source Vdd. When the potential of the dummy bit line BLd becomes higher than the reference voltage Vref, the output of the comparator CMP becomes "H" and the output (nodes B1 to Bn in FIG. 6) of the OR gate ORd also becomes "H". Therefore, the p type transistor Pd is turned OFF to stop the charging to the bit lines. Incidentally, the precharge by the n type transistors Q1 to Qn continues for a period in which the precharge signal /PR is "L".

When the data read out in the preceding read cycle is "1", the bit line (BL in FIG. 6) is not discharged. In this case, the output of the OR gate (OR1, . . . , ORn) becomes "H" (B1, . . . , Bn in FIG. 6) and the p type transistor (P1 Pn) is kept OFF. Therefore, the bit line is not charged from the power source Vdd.

In this embodiment, the dummy bit line is rapidly charged from the power source Vdd while sensing the potential of the dummy bit line by the comparator CMP and confirming the preceding discharge by the OR circuit. Therefore, a sufficient precharge voltage can be obtained within a short time even if the power source voltage is increased and the width of the precharge signal becomes small. Consequently, there is no detection error of the sense amplifiers (SA1 to SAn).

As a modification of the third embodiment, the AND gate AND1 may be removed. In such case, "0" is written in all of the dummy memory cells such that the potentials thereof can be discharged through the sub bit line SubBL when any one of the selection transistors S thereof is turned ON during the sampling period.

When the conventional timing generator circuit designed in accommodation to the low power voltage source is used with a high voltage power source, the pulse width of the precharge signal becomes too small to sufficiently precharge the bit lines, resulting in the erroneous reading of the memory content. According to the semiconductor memory device of the present invention, which is additionally provided with the second precharge means, however, it is possible to increase the precharge drive power and there is no erroneous reading of the memory content even if the width of the precharge pulse signal is small. Further, since the present semiconductor memory device can accommodate to the precharge signal having small width, it is possible to shorten the time necessary to read out the memory content, that is, increase the operating speed of the semiconductor memory device. Therefore, the repetition period can be shortened when a continuous reading is performed.

Although the present invention has been described with reference to the specific preferred embodiments, the present semiconductor memory device is not limited to them and various modifications thereof may be possible within the scope of the present invention.

As described hereinbefore, the semiconductor memory device according to the present invention performs a stable voltage detection with a wide range power source voltage, so that it is possible to reliably read the memory content from a low voltage to a high voltage.

What is claimed is:

1. A semiconductor device comprising:
   a bit line;
   a memory cell connected to said bit line;
   a reference voltage terminal supplying a reference voltage;
   a transistor connected between said bit line and a first node, and said transistor having a control terminal connected to said reference voltage terminal;
   a pre-charging terminal supplying a pre-charging signal;
   a sense-amplifier connected to said first node and receiving said pre-charging signal, said sense-amplifier pre-charging said bit line via said transistor in response to said pre-charging signal; and
   a pre-charging circuit connected to said bit line, said reference terminal and said pre-charging terminal, said pre-charging circuit pre-charging said bit line in response to said pre-charging signal.

2. The semiconductor device as claims in claim 1, wherein said transistor comprises a n type MOS transistor.

3. The semiconductor device as claimed in claim 2, wherein said n type MOS transistor has a zero threshold voltage.

4. The semiconductor device as claimed in claim 1, wherein said pre-charging circuit has a first transistor of a first conductivity type connected between a power supply line and a second node, a control terminal of said first transistor connected to said pre-charging terminal, and a second transistor of a second conductivity type connected between said second node and said bit line, a control terminal of said second transistor connected to said reference voltage terminal.

5. The semiconductor device as claimed in claim 1, wherein said transistor comprises a n type MOS transistor; said first transistor of said pre-charging circuit comprises a p-type MOS transistor;
   and said second transistor of said pre-charging circuit comprises a n-type MOS transistor.

6. The semiconductor device as claimed in claim 5, wherein said ntype MOS transistor has a zero threshold voltage.

7. The semiconductor device as claimed in claim 1, wherein said pre-charging circuit has a pre-charging part activated for pre-charging said bit line in response to said pre-charging signal and deactivated in response to a control signal, and a comparing part comparing said reference voltage to a voltage of said bit line and outputting said control signal based on a comparing result.

8. A semiconductor device as claimed in claim 1, wherein said pre-charging circuit comprises:

an inverter having an input connected to said pre-charging terminal and having an output;

a NAND gate having one input connected to said output of said inverter, said NAND having an output;

a pre-charging transistor connected between a power supply line, and said bit line and having a control terminal connected to said output of said NAND gate;

a comparator having one input connected to said reference voltage terminal and another input connected to said bit line, said comparator having an output connected to another input of said NAND gate.

9. A semiconductor device as claimed in claim 8, wherein said pre-charging transistor comprises a p-type MOS transistor, and said transistor comprises a n-type MOS transistor.

10. A semiconductor device as claimed in claim 9, wherein said n-type MOS transistor has a zero threshold voltage.

11. A semiconductor device as claimed in claim 1, wherein said pre-charging circuit comprises:

a dummy circuit having a dummy memory cell connected to a dummy bit line, said dummy circuit comprising:

a dummy transistor connected between said dummy bit line and a first dummy node, said dummy transistor having a control terminal connected to said reference voltage terminal;

a dummy sense amplifier connected to said first dummy node and receiving said pre-charging signal, said dummy sense amplifier pre-charging said dummy bit line via said dummy transistor in response to said pre-charging signal; and a dummy pre-charging circuit connected to said dummy bit line, said bit line, said reference terminal and said pre-charging terminal, said dummy pre-charging circuit pre-charging said bit line in response to said pre-charging signal.

12. A semiconductor device as claimed in claim 11, wherein said semiconductor device includes a data latch connected to an output of said sense amplifier, and said pre-charging circuit comprises:

a first transistor of a first conductivity type connected between a power supply line and said bit line, and an OR circuit having one input connected to an output of said data latch and an output connected to a control terminal of said first transistor; and wherein said dummy pre-charging circuit comprises:

a dummy OR circuit having one input connected to said pre-charging terminal;

a dummy first transistor connected between said dummy bit line and said power supply line and having a control terminal connected to an output of said dummy OR circuit;

said output of said dummy OR circuit also connected to another input of said OR circuit of said pre-charging circuit; and a comparator having one input connected to said dummy bit line and another input connected to said reference voltage terminal, an output of said comparator connected to another input of said dummy OR circuit.

13. A semiconductor device comprising:

a bit line;

a memory cell connected to said bit line;

a reference voltage terminal supplying a reference voltage;

a pre-charge terminal supplying a pre-charge signal;

a first pre-charging circuit connected to said bit line and pre-charging said bit line to said reference voltage during a predetermined period defined by said pre-charging signal;

a second pre-charging circuit provided independent of said first pre-charging circuit, said second pre-charging circuit connected to said bit line and pre-charging said bit line to said reference voltage during said predetermined period defined by said pre-charging signal.

14. A semiconductor device as claimed in claim 13, wherein said first pre-charging circuit comprises:

a transistor connected between said bit line and a first node, and said transistor having a control terminal connected to said reference voltage terminal;

a pre-charging terminal supplying a pre-charging signal; and a sense-amplifier connected to said first node and receiving said pre-charging signal, said sense-amplifier pre-charging said bit line via said transistor in response to said pre-charging signal; and wherein said second pre-charging circuit is also connected to said reference terminal and said pre-charging terminal, said second pre-charging circuit pre-charging said bit line in response to said pre-charging signal.

15. The semiconductor device as claimed in claim 14, wherein said transistor comprises a n type MOS transistor.

16. The semiconductor device as claimed in claim 15, wherein said n type MOS transistor has a zero threshold voltage.

17. The semiconductor device as claimed in claim 14, wherein said second pre-charging circuit has a first transistor of a first conductivity type connected between a power supply line and a second node, a control terminal of said first transistor connected to said pre-charging terminal, and a second transistor of a second conductivity type connected between said second node and said bit line, a control terminal of said second transistor connected to said reference voltage terminal.

18. The semiconductor device as claimed in claim 14, wherein said first pre-charging circuit has a pre-charging part activated for pre-charging said bit line in response to said pre-charging signal and deactivated in response to control signal, and a comparing part comparing said reference voltage to a voltage of said bit line and outputting said control signal based on a comparing result.

* * * * *